(12) United States Patent
Figuerado et al.

(10) Patent No.: US 6,934,157 B2
(45) Date of Patent: Aug. 23, 2005

(54) UNIVERSAL HEAT SINK RETENTION MODULE FRAME

(75) Inventors: Stephen Figuerado, Round Rock, TX (US); Vibora Sim, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/716,264

(22) Filed: Nov. 18, 2003

(65) Prior Publication Data

US 2005/0105275 A1 May 19, 2005

(51) Int. Cl.$^7$ ................................................ H05K 7/20
(52) U.S. Cl. ................... 361/704; 361/719; 257/718; 257/719; 257/727; 165/80.3; 165/185; 26/457; 26/458; 248/510
(58) Field of Search ............................ 361/704, 707, 361/709, 719; 274/718, 719, 722, 727; 174/16.1, 16.3; 165/80.3, 185; 248/316.7; 24/293–295

(56) References Cited

U.S. PATENT DOCUMENTS

| | | | |
|---|---|---|---|
| 6,344,971 B1 * | 2/2002 | Ju ................................ | 361/704 |
| 6,519,153 B1 | 2/2003 | Shia et al. | |
| 6,570,763 B1 | 5/2003 | McHugh et al. | |
| 6,618,253 B1 * | 9/2003 | Szu et al. .................... | 361/719 |
| 6,648,664 B1 * | 11/2003 | McHugh et al. ............ | 439/331 |
| 6,678,160 B1 * | 1/2004 | Liu ............................. | 361/719 |
| 6,707,672 B2 * | 3/2004 | Liu ............................. | 361/704 |
| 6,771,506 B2 * | 8/2004 | Lee et al. .................... | 361/704 |
| 6,785,136 B2 * | 8/2004 | Chang et al. ............... | 361/704 |
| 6,822,869 B2 * | 11/2004 | Huang et al. ............... | 361/704 |

\* cited by examiner

*Primary Examiner*—Boris Chervinsky
(74) *Attorney, Agent, or Firm*—Haynes and Boone, LLP

(57) ABSTRACT

A heat sink retention frame includes a plurality of base members mounted on a board member. A plurality of retention members are provided, with each retention member having a first end moveably connected to a first connector portion of one of the base members, and having a second end extended into connection with a second connector portion of another of the base members.

21 Claims, 5 Drawing Sheets

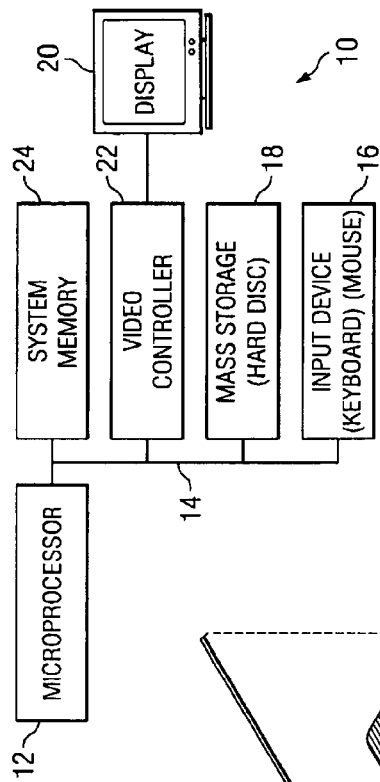
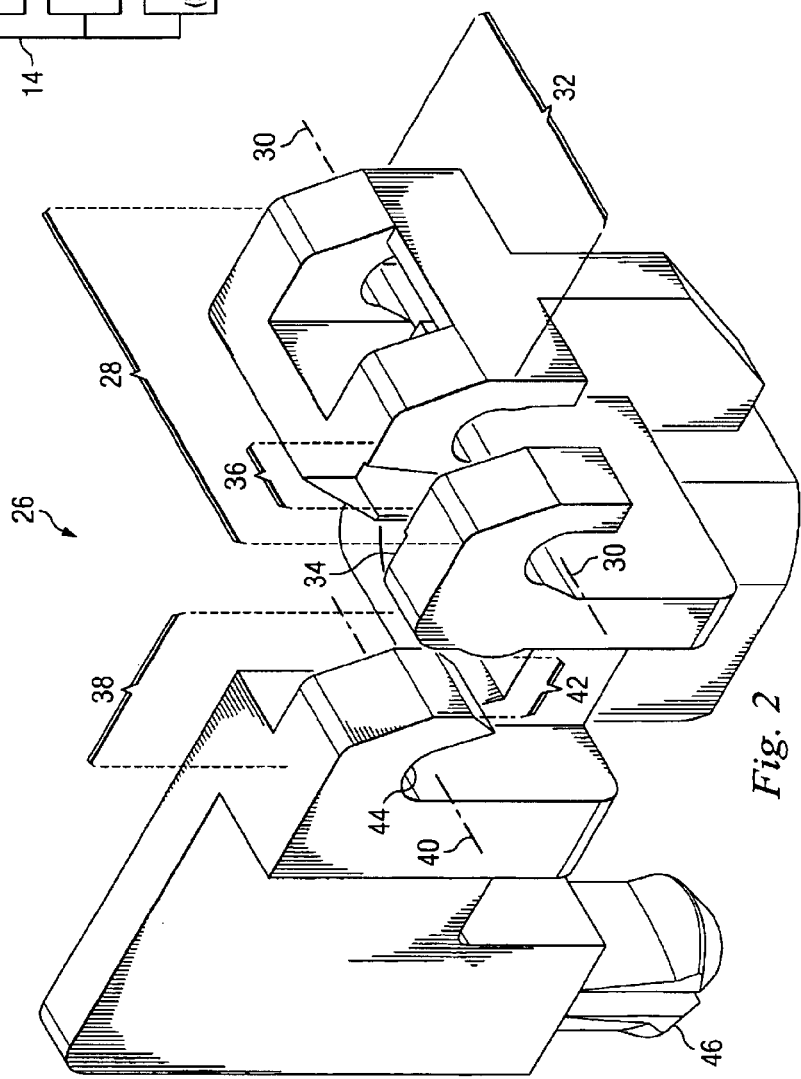

UNIVERSAL HEAT SINK RETENTION MODULE FRAME

BACKGROUND

The present disclosure relates generally to information handling systems, and more particularly to a heat sink retention frame.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems include heat sink retention frames in order to secure heat sinks to components of the system that generate heat, typically processors. These frames are limited for use on different processing platforms for a number of reasons. Due to their set widths and lengths, the size of the heat sink base that can be used on the platform is restricted. This can result in the use of less than optimal heat sinks, and in turn, less than optimal thermal dissipation.

These frames often sit adjacent the processors in the information handling system. This results in a limitation on the available positioning of the frame and the heat sink, which can result in less than optimal placement of the cooling fans.

The frames generally have a larger area in contact with the circuit board than is necessary, which limits their use and orientation due to interference with components on the board. Structures in which the frame extends over the circuit board increase the height of the frame, which can result in less than optimal placement of the cooling fans.

The heat sink retention clips used with these retention frames are restricted to orientation in one direction which restricts orientation of the heat sink frame due to interference between the retention clips and the processor. In addition, the restricted orientation of the clips can result in less than optimal placement of the cooling fans due to the height of the retention clips.

Accordingly, it would be desirable to provide a improved heat sink retention frame in an information handling system absent the disadvantages found in the methods discussed above.

SUMMARY

According to one embodiment, a heat sink retention frame is disclosed which includes a plurality of base members mounted on a board member. A plurality of retention members are provided, with each retention member having a first end moveably connected to a first connector portion of one of the base members, and having a second end extended into connection with a second connector portion of another of the base members.

A principal advantage of this embodiment is that it lends itself for re-use on different processor platforms. Individual base members may be mounted on the board member with the appropriate spacing to allow use of the optimal size heat sink for a given thermal solution. Individual retention members may be re-oriented about the frame, allowing the frame to be adjusted for different platforms or changes in a particular platform.

BRIEF DESCRIPTION OF THE DRAWINGS

FIG. 1 is a diagrammatic view illustrating an embodiment of an information handling system.

FIGS. 2 and 3 are perspective views illustrating an embodiment of a base member.

DETAILED DESCRIPTION

Figure 3:
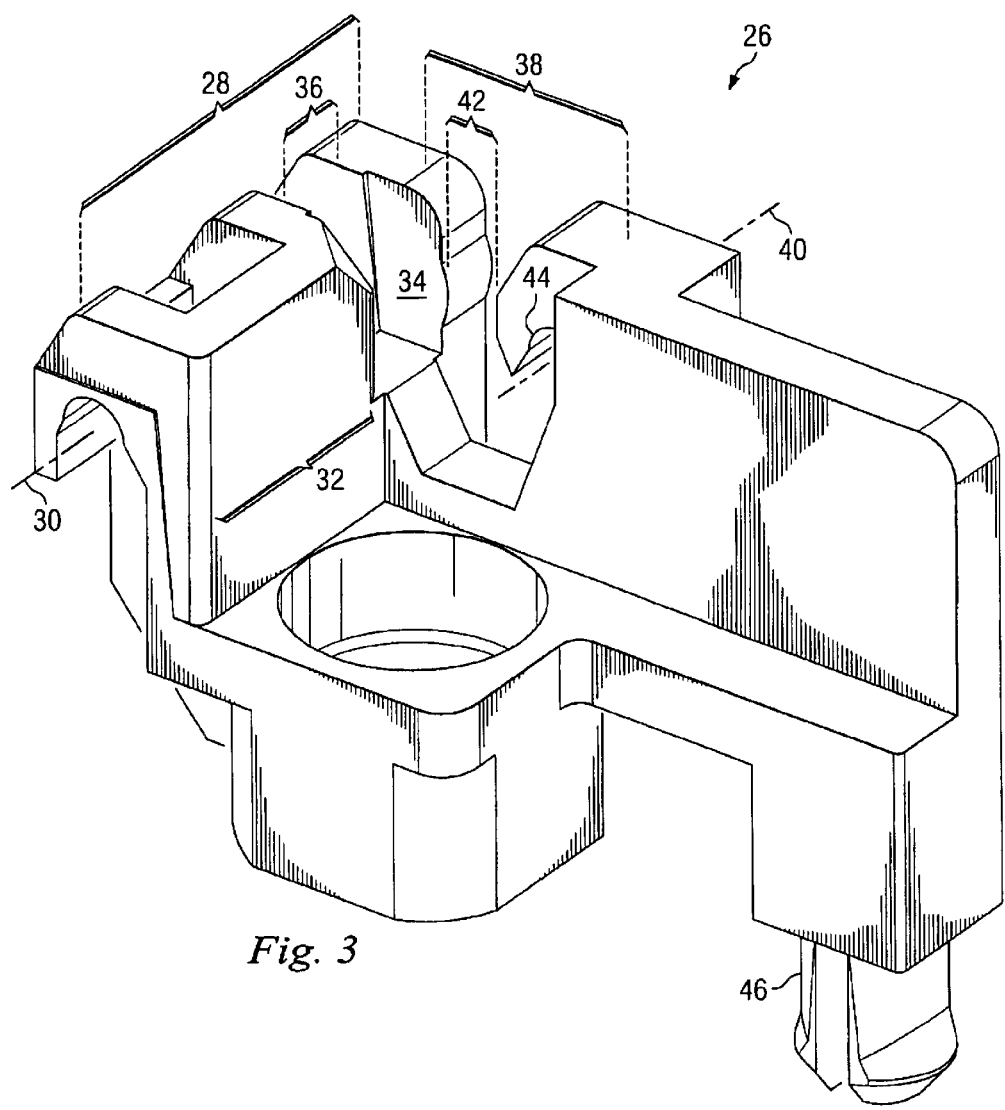

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

In one embodiment, information handling system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

A base member 26, FIGS. 2 and 3, is one of a plurality of identical base members discussed below. Base member 26 includes a first connector portion 28 with a first connection axis 30. First connector portion 28 includes a pivotal connection 32 spaced apart from a guide surface 34 to create a channel 36. Base member 26 also includes a second connector portion 38 with a second connection axis 40. Second connector portion 38 is oriented substantially perpendicular to first connector portion 28 and includes opening 42 and latch connection 44. A board mounting member 46, further described below, extends from base member 26.

Figure 4:
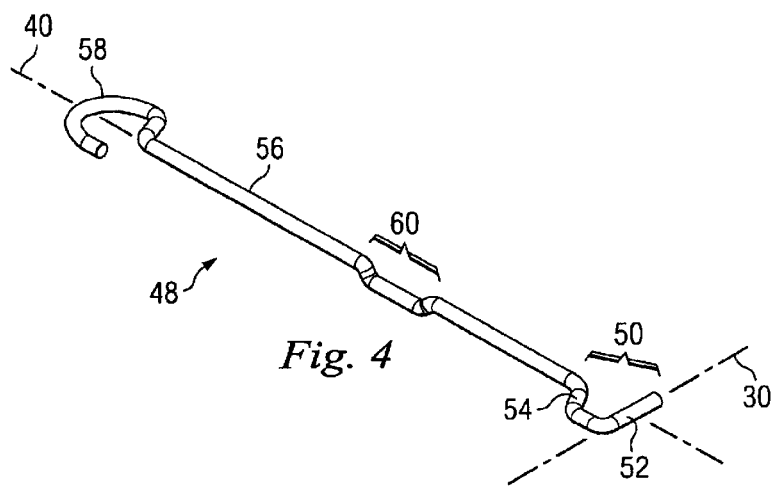
FIG. 4 is a perspective view illustrating an embodiment of a retention member.

A retention member 48, FIG. 4, is one of a plurality of retention members discussed below. Retention member 48 includes a first connection end 50 and a second connection end 56. First connection end 50 includes a hinge member 52 and a channel member 54. Hinge member 52 is collinear with first connection axis 30 such that retention member 48 may pivot about first connection axis 30 by hinge member 52. Second connection end 56 is at an opposite end of retention member 48 from first connection end 50. A handle 58 is located along the length of the retention member 48, adjacent to second end 56. A heat sink contact 60 is located between first connection end 50 and second connection end 56.

Figure 5:
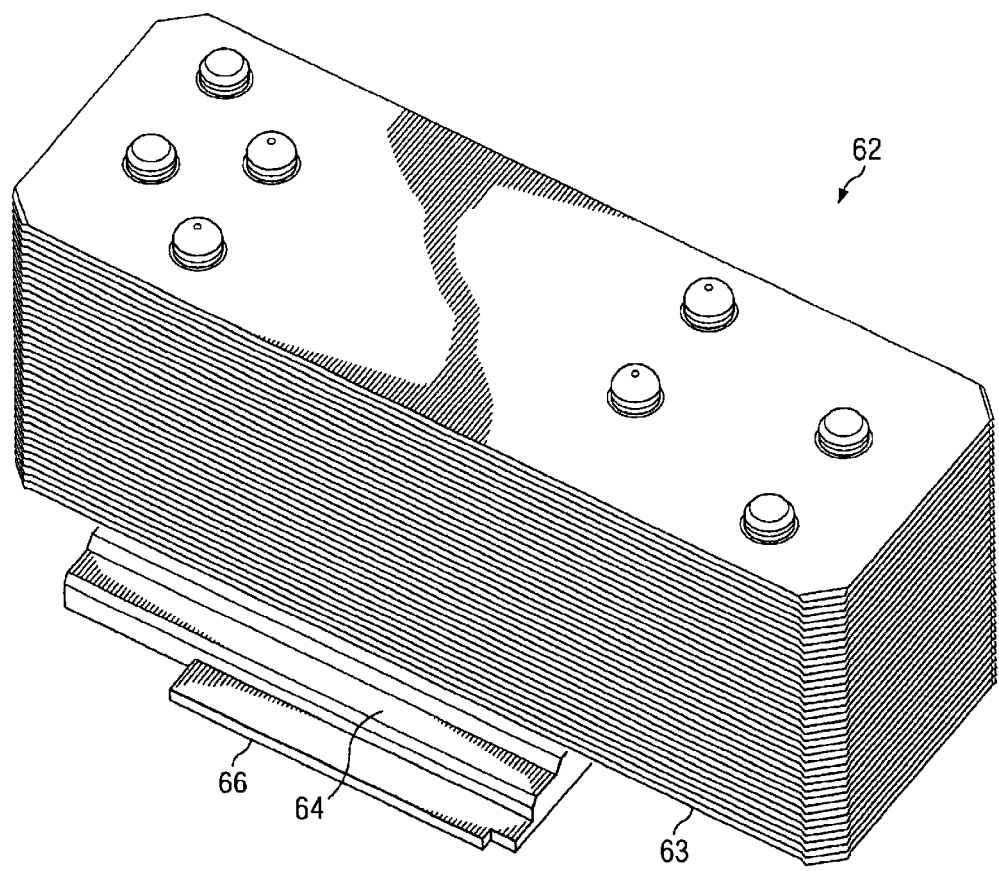
FIG. 5 is a perspective view illustrating an embodiment of a heat sink.

A heat sink 62, FIG. 5, includes a finned heat sink body 63 having a heat sink base 64. A retention member contact surface 66 extends from heat sink base 64.

Figure 6:
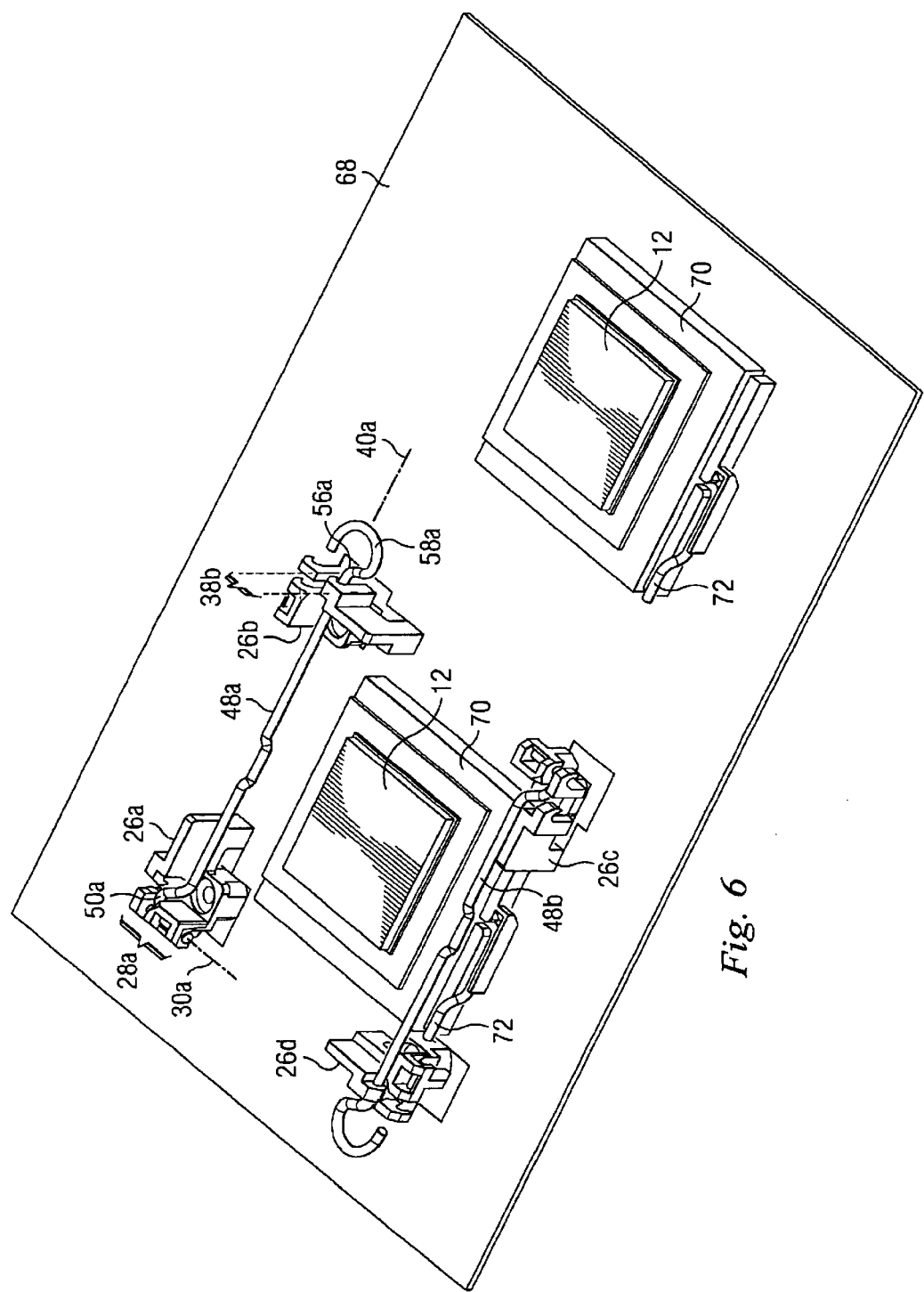
FIG. 6 is a perspective view illustrating an embodiment of a board member with a pair of processors on the board member and a heat sink retention frame mounted on the board member for use with one of the processors.
Figure 7:
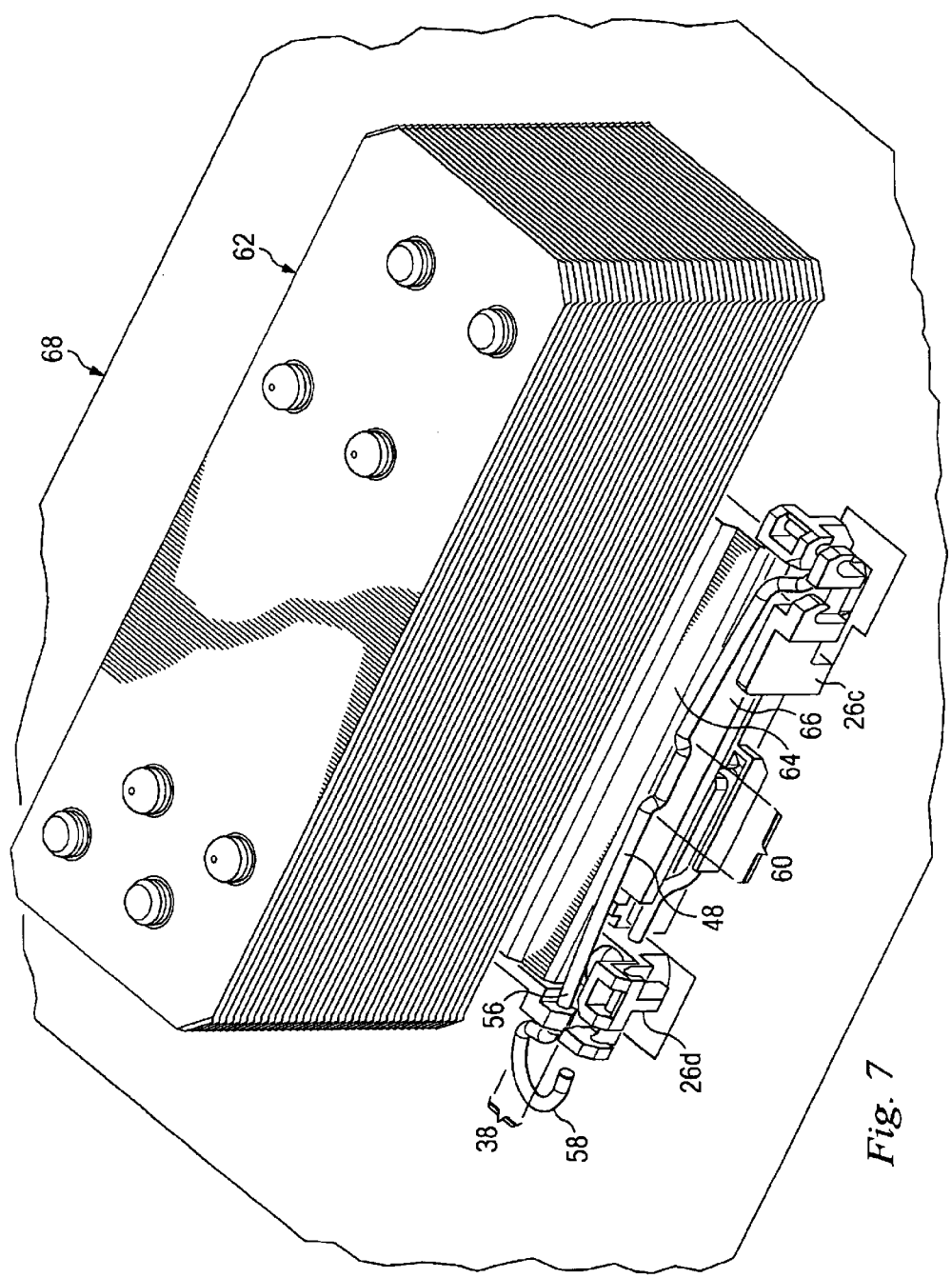
FIG. 7 is a perspective view illustrating a heat sink connected to a heat sink retention frame.

A board member 68, which is included in a chassis (not shown), FIGS. 6 and 7, includes a processor socket 70 mounted on board member 68. The processor socket 70 allows microprocessor 12 to be mated to board member 68 in order to connect it with other components attached to board member 68. Processor socket 70 includes a processor socket release latch 72 which is used to disconnect and release microprocessor 12 from processor socket 70 once the two have been mated.

Multiple base members 26a, 26b, 26c, and 26d are mounted on board member 68 by inserting board mounting member 46 through a receiver or aperture (not shown) in the board member 68. The mounting position of base members 26 will depend on the size of a heat sink base 64 on a heat sink 62 that is needed to cool microprocessor 12. The orientation of microprocessor 12 and hence processor socket 70 and processor socket release latch 72 also dictates the mounting position of base members 26, as shown in FIG. 6. Base member 26c and base member 26d are spaced apart to allow processor socket release latch 72 to be positioned between them. Adjacent base members 26a, 26b, 26c, and 26d are oriented at about ninety degrees relative to each other and substantially equal distances from each other. Mounting base members 26 substantially equal distances from each other allows the use of identical retention members 48 that may be connected to any adjacent base members 26.

Retention member 48a has first end 50a pivotally connected to first connector portion 28a on base member 26a. This allows retention member 48a to pivot about first connection axis 30a. In more detail (see FIGS. 3, 4, and 5), hinge member 52 on retention member 48 is placed in pivotal connection 32 on base member 26. Channel member 54 on retention member 48 sits in channel 36 on base member 26. Guide surface 34 holds hinge member 52 in pivotal connection 32 during the range of pivotal motion of retention member 48.

Retention member 48a is in a retaining mode when second connection end 56a is latched, using handle 58a, to second connector portion 38b on base member 26b, with retention member 48a lying along second connection axis 40a. In more detail (see FIGS. 3, 4, and 5), second connection end 56 on retention member 48 passes through opening 42 on base member 26 and is engaged with latch 44 to secure second connection end 56 to base member 26.

The length of retention member 48 is determined by the placement of the base members 26, as retention member 48 must be long enough to connect to two adjacent base members 26. Ideally, all base members 26 will be substantially equal distances apart, allowing use of identical retention members 48, any one being connectable to any two adjacent base members 26.

In the above described retaining mode, FIG. 7, heat sink contact 60 on retention member 48 engages heat sink base 64 at retention member contact surface 66 and holds heat sink 62 in abutment with microprocessor 12. Handle 58 is used to latch and unlatch second connection end 56 from second connector portion 38 and in turn retain or release heat sink 62. The low profile of base members 26c, 25d and retention member 48 allows other system components, such as cooling fans (not shown), to be placed in the space over them and adjacent to heat sink 62.

In FIG. 6, retention member 48b connects to base members 26c and 26d in the same manner as retention member 48a, but with opposite orientation. This results in retention members 48a and 48b being substantially parallel to each other. Processor socket release latch 72 sits below retention member 48b in FIG. 6. If increased access to processor socket release latch 72 or a different heat sink 62 orientation is desired, retention member 48a may be connected to base members 26a and 26d, and retention member 48b may be connected to base members 26b and 26c, leaving no retention member 48 above processor socket release latch 72 and allowing the heat sink 62 to be rotated substantially ninety degrees.

As can be seen, the principle advantages of these embodiments are that a heat sink retention frame is provided that may be used across different system platforms with a number of benefits. The frame is adjustable to accommodate the optimal heat sink size for a given thermal solution, it has a limited area of contact between the frame and the board member which allows more components to be used on the board member, and its components allow multiple orientations of the frame and the heat sink, which allows orientation of the heat sink frame on the board member independent of the orientation chosen for the processor and results in less interference with the processor socket release latch and the cooling fans. The same base members may be spaced according to a desired length of the retention members to accommodate various sizes of heat sinks.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A heat sink retention frame comprising:

a plurality of spaced apart base members mounted on a board member, each base member having a first connector portion and a second connector portion;

a plurality of retention members each having a first end movably connected to the first connector portion of one of the base members and having a second end extended into connection with the second connector portion of another of the base members; and wherein each base member is oriented at about ninety degrees relative to an adjacent base member.

2. The frame of claim 1 wherein the connector portions on each base member include a pivotal connection and a latch connection.

3. The frame of claim 1 wherein the first end is pivotally connected and the second end is latched.

4. The frame of claim 1 wherein each retention member spans a space between two adjacent base members.

5. A heat sink retention frame comprising:

a plurality of spaced apart base members mounted on a board member;

a plurality of connector portions on each base member;

a plurality of retention members, each retention member having a first end connected to one of the connector portions on one of the base members and a second end connected to another of the connector portions on another of the base members; and wherein each base member is oriented at about ninety degrees relative to an adjacent base member.

6. The frame of claim 5 wherein the connector portions on each base member include a pivotal connection and a latch connection.

7. The frame of claim 5 wherein the first end is pivotally connected and the second end latched.

8. The frame of claim 5 wherein each retention member spans a space between two adjacent base members.

9. A heat sink retention apparatus comprising:

a plurality of spaced apart base members mounted on a board member;

a plurality of interchangeable retention members, each retention member having a first end pivotally connected to any one of the base members and a second end latched to an adjacent one of the base members; and wherein each base member is oriented at about ninety degrees relative to an adjacent base member.

10. The apparatus of claim 9 wherein each base member includes a pivotable connector portion and a latch connector portion.

11. The apparatus of claim 9 wherein each retention member spans a space between two adjacent base members.

12. A heat sink retention apparatus comprising:

a plurality of base members movably mounted on a board member in a spaced apart relationship;

a plurality of variable sized retention members selected to correspond to the spaced apart base members, each retention member having a first end pivotally connected to any one of the base members, and a second end latched to an adjacent one of the base members, such that a first retention member is substantially parallel to a second retention member; and wherein each base member is oriented at about ninety degrees relative to an adjacent base member.

13. The apparatus of claim 12 wherein each base member includes a pivotable connector portion and a latch connector portion.

14. The apparatus of claim 12 wherein each retention member spans a space between two adjacent base members.

15. An information handling system comprising:

a board member;

a processor mounted on the board member;

a plurality of spaced apart base members mounted on the board member adjacent the processor, each base member having a first connector portion and a second connector portion;

a plurality of retention members each having a first end movably connected to the first connector portion of one of the base members and having a second end extended into connection with the second connector portion of another of the base members; and wherein each base member is oriented at about ninety degrees relative to an adjacent base member.

16. The system of claim 15 wherein the connector portions on each base member include a pivotal connection and a latch connection.

17. The system of claim 15 wherein the first end is pivotally connected and the second end is latched.

18. The system of claim 15 wherein each retention member spans a space between two adjacent base members.

19. A method for securing a heat sink to a board member comprising:

providing a board member;

mounting a processor on the board member;

providing a heat sink in abutment with the processor;

providing a plurality of spaced apart base members mounted on the board member adjacent the processor;

providing a plurality of retention members with a first end and a second end;

placing the heat sink on the base members;

securing the heat sink to the base members by pivotally connecting the first end of each retention member to a first connector portion of one of the base members and extending the second end of each retention member into latched connection with a second connector portion of another of the base members, each of the retention members engaging the heat sink; and each base member being oriented at about ninety degrees relative to an adjacent base member.

20. An information handling system comprising:

a support member;

a heat generating component mounted on the support member;

a plurality of spaced apart base members mounted on the support member adjacent the heat generating component, each base member having a first connector portion and a second connector portion; and a plurality of retention members each having a first end movably connected to the first connector portion of one of the base members and having a second end extended into connection with the second connector portion of another of the base members, each base member being oriented at about ninety degrees relative to an adjacent base member.

21. A method for securing a heat sink to a support member comprising:

providing a support member;

mounting a heat generating component on the support member;

providing a heat sink in abutment with the heat generating component;

providing a plurality of spaced apart base members mounted on the support member adjacent the heat generating component;

providing a plurality of retention members with a first end and a second end;

placing the heat sink on the base members; and securing the heat sink to the base members by pivotally connecting the first end of each retention member to a first connector portion of one of the base members and extending the second end of each retention member into latched connection with a second connector portion of another of the base members, each of the retention members engaging the heat sink, each base member being oriented at about ninety degrees relative to an adjacent base member.

* * * * *